(12) United States Patent
Meiler

(10) Patent No.: US 11,806,737 B2
(45) Date of Patent: Nov. 7, 2023

(54) WORKPIECE CARRIER DEVICE AND COATING ARRANGEMENT

(71) Applicant: OERLIKON SURFACE SOLUTIONS AG, PFAFFIKON, Pfaffikon (CH)

(72) Inventor: Rudolf Meiler, Schiers (CH)

(73) Assignee: OERLIKON SURFACE SOLUTIONS AG, Pfaffikon, Pfaffikon (CH)

( * ) Notice: Subject to any disclaimer, the term of this patent is extended or adjusted under 35 U.S.C. 154(b) by 167 days.

(21) Appl. No.: 17/288,740

(22) PCT Filed: Oct. 28, 2019

(86) PCT No.: PCT/EP2019/079376
§ 371 (c)(1),
(2) Date: Apr. 26, 2021

(87) PCT Pub. No.: WO2020/084164
PCT Pub. Date: Apr. 30, 2020

(65) Prior Publication Data
US 2021/0394216 A1    Dec. 23, 2021

(30) Foreign Application Priority Data

Oct. 26, 2018 (DE) ............... 10 2018 126 862.9

(51) Int. Cl.
*B05B 13/02* (2006.01)
*F16H 1/28* (2006.01)

(52) U.S. Cl.
CPC ...... *B05B 13/0228* (2013.01); *B05B 13/0207* (2013.01); *B05B 13/0292* (2013.01); *F16H 1/28* (2013.01)

(58) Field of Classification Search
USPC .......... 118/500–503, 728; 219/121.6, 121.67
See application file for complete search history.

(56) References Cited

U.S. PATENT DOCUMENTS 3,853,091 A  12/1974 Christensen et al.
4,151,059 A   4/1979 Kuehnle
(Continued)

FOREIGN PATENT DOCUMENTS

CN    101253281 A   8/2008
CN    105 586 577 A1  5/2016
(Continued)

OTHER PUBLICATIONS

Office Action for Chinese Patent Application No. 201980070054.6, dated Sep. 19, 2022.
(Continued)

*Primary Examiner* — Yewebdar T Tadesse
(74) *Attorney, Agent, or Firm* — PEARL COHEN ZEDEK LATZER BARATZ LLP

(57) ABSTRACT

The invention relates to a workpiece carrier device (1) comprising: a drive gear (3) for receiving workpiece arrangements (4), which is rotatable about a main axis (2), a number of drive bodies (6), which are arranged on the drive gear (3), are respectively rotatable about an axis of rotation (5) and each have a drive pinion (8) and a stationary internal input gear (9) with an inner toothing, which meshes with the drive pinions (8), wherein the axes of rotation (5) extend parallel to the main axis (2) and are arranged in an annular region of the drive gear (3) that runs concentrically in relation to the main axis (2), and so, when there is rotation of the drive gear (3) relative to the internal input gear (9), the drive bodies (6) rotate about their respective axes of rotation (5), wherein the internal input gear (9) and the drive bodies (6) with their drive pinions (8) are formed and arranged in relation to one another and a working clearance (S) is provided between the internal input gear (9) and the drive pinions (8) such that a driving effect is transferred to all of the drive pinions (8) equally during operation. The invention
(Continued)

also relates to a coating arrangement 100 comprising such a workpiece carrier device (1).

10 Claims, 3 Drawing Sheets

(56) References Cited

U.S. PATENT DOCUMENTS

| | | |
|---|---|---|
| 2002/0094383 A1 | 7/2002 | Zaech et al. |
| 2004/0074445 A1 | 4/2004 | Fujii et al. |
| 2007/0057138 A1 | 3/2007 | Esser |
| 2011/0083604 A1* | 4/2011 | Esser .................. C23C 14/564 |
| | | 118/500 |
| 2012/0103265 A1 | 5/2012 | Yamaguchi et al. |
| 2014/0008857 A1 | 1/2014 | Esser et al. |
| 2015/0136029 A1 | 5/2015 | Fujii |

FOREIGN PATENT DOCUMENTS

| | | |
|---|---|---|
| DE | 19803278 A1 | 8/1999 |
| DE | 102004027989 A1 | 3/2006 |
| DE | 60314087 T2 | 1/2008 |
| EP | 2048263 A1 | 4/2009 |
| KR | 101646698 B1 | 8/2016 |

OTHER PUBLICATIONS

First Examination Report for Indian Patent Application No. 202117022697, dated Oct. 10, 2022.

International Search Report of PCT Application No. PCT/EP2019/079376, dated Feb. 7, 2020.

Yalamanchili, et al. Exploring The High Entropy Alloy Concept in (AlTiVNbCr)N, Thin Solid Films, vol. 636, pp. 346-352, 2017.

* cited by examiner

WORKPIECE CARRIER DEVICE AND COATING ARRANGEMENT

CROSS-REFERENCE TO RELATED APPLICATIONS

This application is a National Phase Application of PCT International Application No. PCT/EP2019/079376, International Filing Date Oct. 28, 2019, claiming priority of German Patent Application No. 10 2018 126 862.9, filed Oct. 26, 2018, which is hereby incorporated by reference.

FIELD OF THE INVENTION

The present disclosure relates to a workpiece carrier device for moving workpieces comprising a drive gear for receiving workpiece arrangements, which is rotatable about a main axis, and a number of drive bodies respectively rotatable about an axis of rotation and arranged on the drive gear.

BACKGROUND OF THE INVENTION

Workpiece carrier devices of this type are used to process workpieces, above all in vacuum systems and in particular to coat the workpieces in vacuum systems. They are used to move the workpieces which are mounted on a plurality of workpiece carrier units in a coating chamber in order to ensure uniform coating of all exposed surfaces of the workpieces in the coating chamber. Workpiece carrier devices of this type are particularly suitable to move cylindrical or sleeve-shaped workpieces in a coating chamber. In this case, the workpieces are arranged in the form of a crown or ring around the main axis and are moved around the main axis in the coating chamber. In order to achieve uniform coating of all surfaces, in particular of the cylindrical peripheral surfaces, the workpieces are arranged for this purpose in rotatable holders which rotate via the drive bodies about their own axis, namely the axis of rotation. During coating, the workpieces move around the main axis and about the respective axis of rotation, so that all surfaces are moved through the coating material in the coating chamber.

There are workpiece carrier devices in which the workpiece carriers or workpiece carrier units are rotated about the axis of rotation by crank mechanisms in connection with an eccentric disk. However, such drives can be problematic in the case of relatively heavy workpiece arrangements, since in some cases comparatively high actuating forces are required to operate the crank drives, as a result of which the crank drives are also relatively heavy and costly to manufacture. Due to imbalances or the like there can also be the problem that a uniform rotation about the respective axes of rotation cannot be achieved, and therefore the coating results can be unsatisfactory in some cases.

Workpiece carrier (units) driven by gear drives require a high degree of manufacturing effort with regard to the tooth geometries and, due to the high temperature fluctuations (between 20° and 600° C.) in a coating chamber, can be problematic since thermally induced changes in the geometry can impair the function.

Therefore, the object of the present invention is to provide an improved workpiece carrier device which at least partially eliminates these disadvantages.

SUMMARY OF THE INVENTION

According to a first aspect, the present invention provides a workpiece carrier device, comprising a drive gear for receiving workpiece arrangements, which is rotatable about a main axis, a number of drive bodies, which are arranged on the drive gear, are respectively rotatable about an axis of rotation and respectively have a drive pinion and a stationary driving ring gear with internal toothing, which meshes with the drive pinions. The axes of rotation are in this case parallel to the main axis and are arranged in an annular region of the drive gear that is concentric in relation to the main axis, so that, when the drive gear rotates relative to the driving ring gear, the drive bodies rotate about their respective axes of rotation, wherein the driving ring gear is slidably arranged in an adjustment plane running perpendicular to the main axis and the drive bodies with their drive pinions are formed and arranged in relation to one another and a working clearance is provided between the driving ring gear and the drive pinions such that a driving action is transferred to all drive pinions equally during operation.

According to a second aspect, the present invention provides a coating arrangement which is equipped with a workpiece carrier device of this type.

Further aspects and features of the present invention are apparent from the dependent claims, the accompanying drawing and the following description of preferred embodiments.

BRIEF DESCRIPTION OF THE DRAWINGS

Embodiments of the invention will now be described by way of example and with reference to the accompanying drawing, wherein.

DESCRIPTION OF EMBODIMENTS

Figure 1:
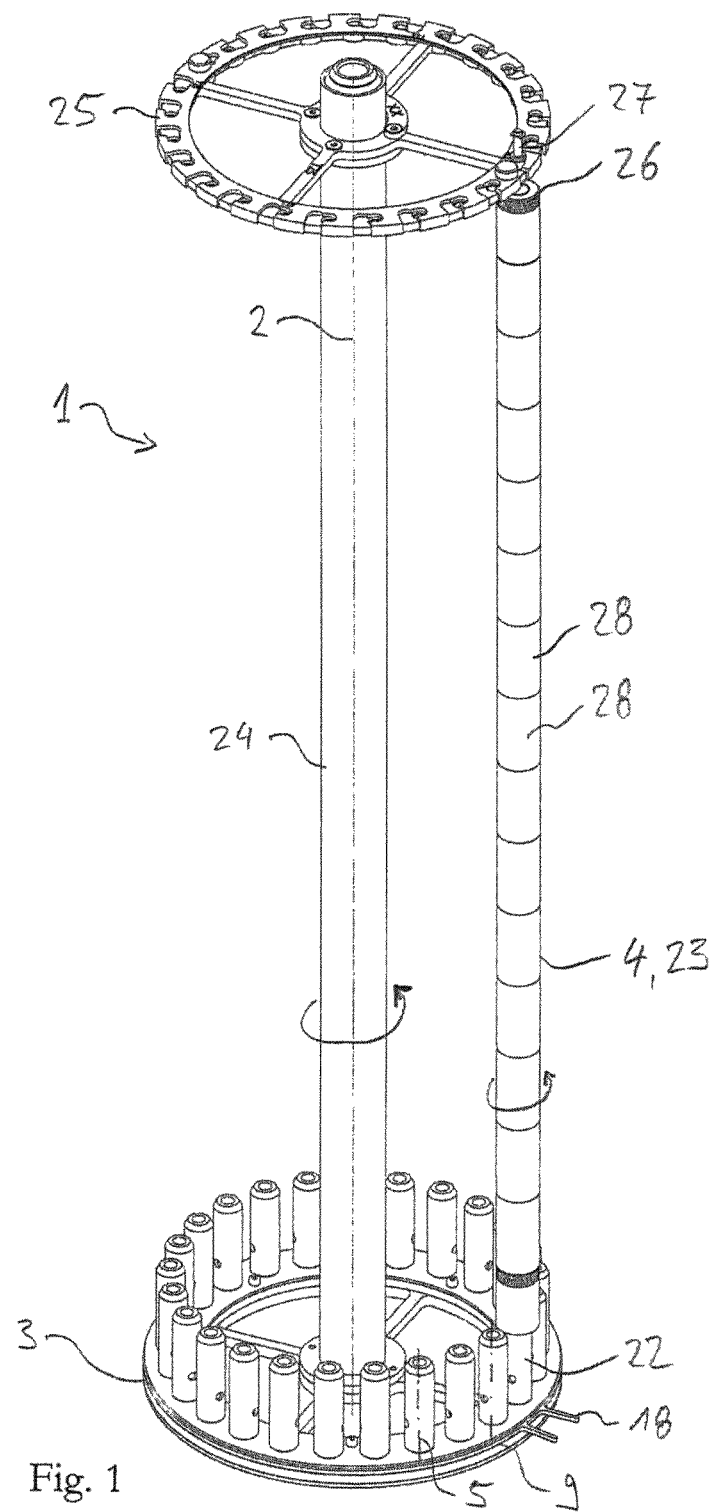
FIG. 1 shows a perspective view of an exemplary embodiment of a workpiece carrier device according to the invention.
Figure 2:
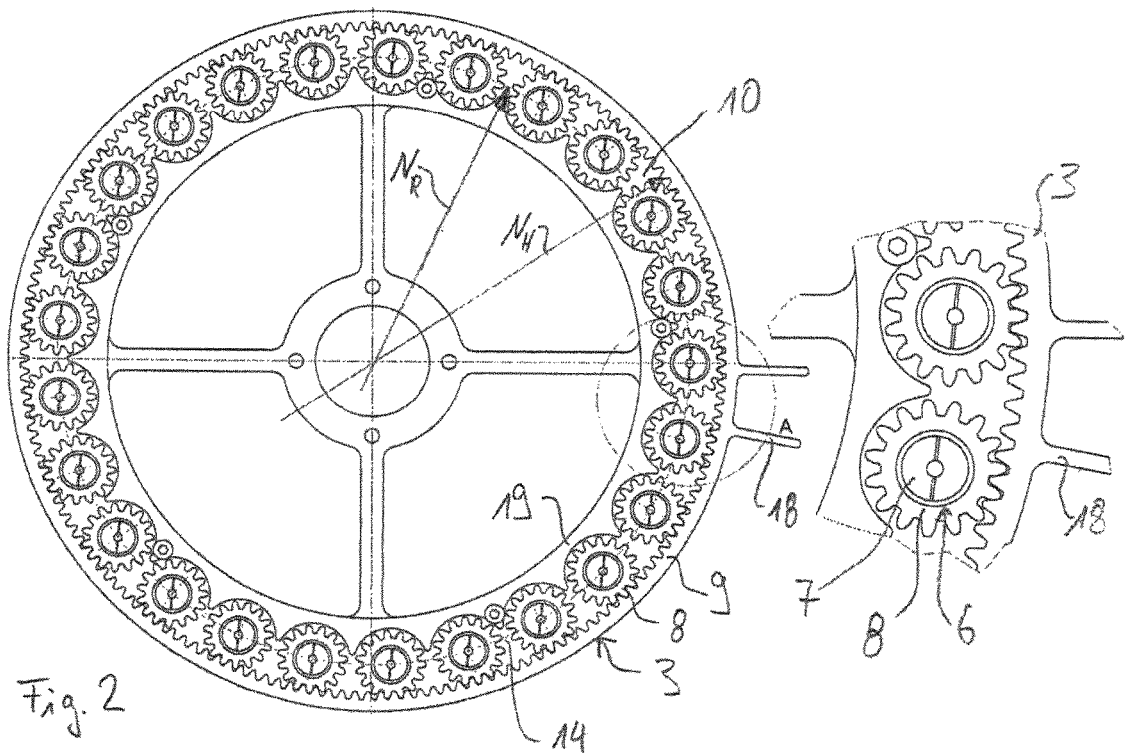
FIG. 2 shows a detailed representation of the drive mechanism of the workpiece carrier device illustrated in FIG. 1 with an enlarged view of the engagement of the drive pinions with the driving ring gear.
Figure 3:
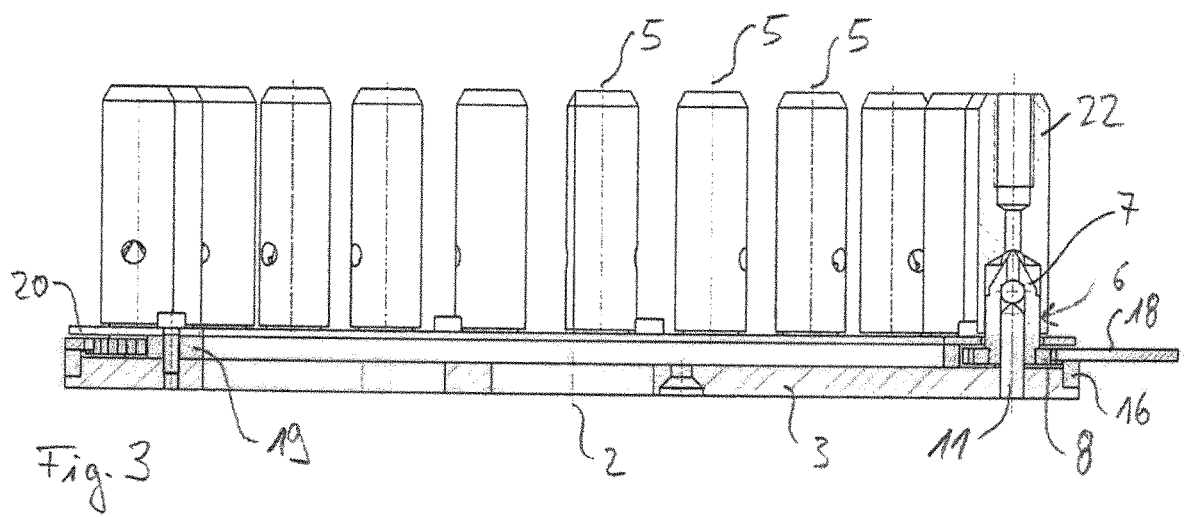
FIG. 3 shows a sectional view of the FIG. 1 drive gear of the workpiece carrier device according to the invention.
Figure 4:
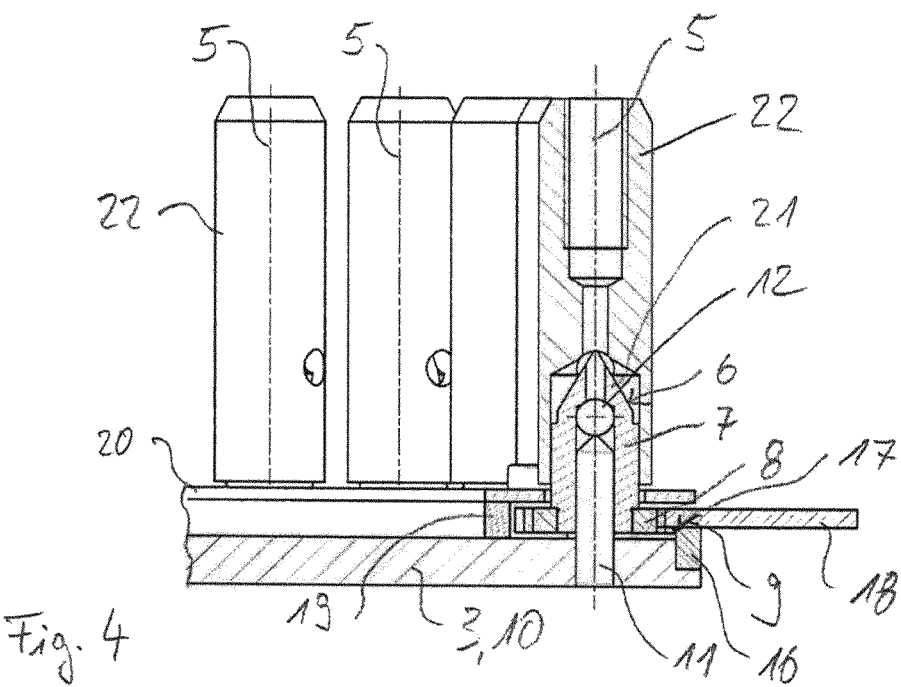
FIG. 4 shows an enlarged sectional view of the drive body.
Figure 5:
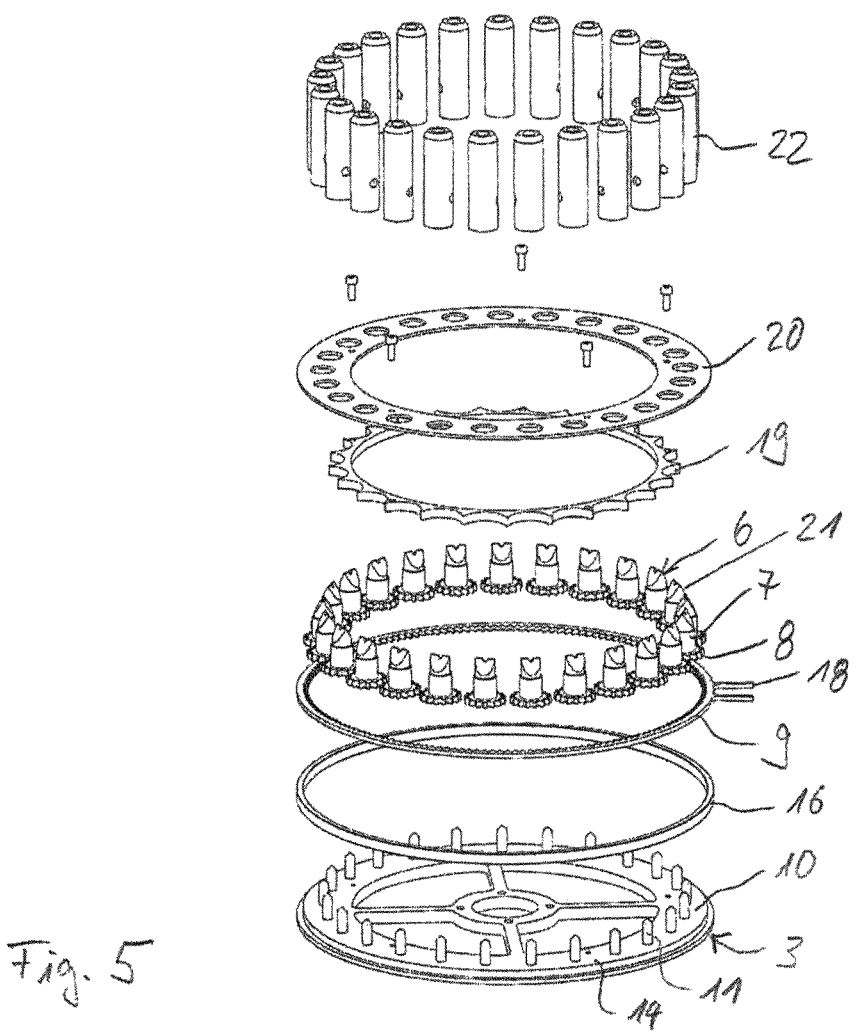
FIG. 5 shows an exploded view of the drive gear with the drive bodies of a workpiece carrier device according to the invention.

FIG. 1 illustrates an embodiment in accordance with the present invention. General explanations on the embodiments are initially provided, followed by a detailed description.

The workpiece carrier device according to the first aspect of the invention is characterized by a drive or working clearance which allows a uniform drive of all drive bodies. This drive clearance is characterized by a particular interaction of the dimensions of the drive pinions and the toothing of the ring gear which surrounds the drive pinions with which the drive pinions mesh. It is also defined by the diameter ratio between the driving ring gear and a ring circle on which the axes of rotation are arranged about which the drive bodies rotate. Finally, the working clearance is also defined by the type and geometry of the internal toothing and the gear rings of the pinions. It is chosen in such a way that temperature-related expansions or shrinkages are also taken into account and neutralized, so that the operation within a temperature range of about 600° C. is guaranteed, in particular for corrosion-resistant steels (e.g. 1.4301 and the like).

The involute toothing has proven to be the most suitable toothing in this case. Other suitable toothings can also be realized.

The diameter ratio between the rotational axis circle (ring circle) and the nominal diameter (tooth root circle diameter or tooth tip circle diameter) of the driving ring gear can here be chosen between 0.75 and 0.9. The ratio between the respective nominal diameter (root circle diameter or tip circle diameter) of the pinions and that of the driving ring gear is between 0.1 and 0.3.

In this case, 3 to 25 drive bodies can be arranged in a corresponding ring gear. The transmission ratio between the drive pinions and the internal toothing of the driving ring gear is selected in such a way that each drive body performs 3 to 15 revolutions in the case of a complete rotation of the drive gear by 360° about the main axis.

The working clearance related to the nominal diameters of the ring gear or the ring circle is 0.05 to 0.6 mm for a diameter range of about 200 to 300 mm, preferably it is between 0.1 to 0.3 mm and in particular 0.1 mm. The ring gear is mounted radially in relation to the meshing drive pinions by the respective tooth root circles, tooth tip circles and/or the pitch circles of the entire toothing taking effect during operation.

There are embodiments in which the working clearance is dimensioned such that the tooth geometries of the drive pinions and of the driving ring gear can be produced in a thermal cutting process, the thermal cutting process being in particular a laser cutting process. It is thus possible to form the effective geometry of the drive pinions and the internal toothing without complex post-processing operations, such as grinding or milling, so that the drive pinions which are cut by means of a laser beam can be used with a driving ring gear produced in the same way without additional post-processing operations.

There are embodiments in which the driving ring gear is arranged so as to be slidable in an adjustment plane extending perpendicular to the main axis. Such a floating or flying bearing of the driving ring gear permits a rotationally fixed mounting relative to the drive gear—for example on a machine frame—and at the same time a self-adjusting working position in the adjustment plane, which results during operation, i.e. when the drive gear rotates. In this way, a smooth-running, low-wear drive can be realized.

There are embodiments in which the adjustment plane is defined by a slide ring which is arranged between the drive gear and the driving ring gear and which forms a sliding pair with the driving ring gear in the adjustment plane. This arrangement ensures that easily adjustable self-centering of the driving ring gear in the sliding plane is guaranteed. In this case, the ring gear can be made of a suitable steel material, for example, while the slide ring can be made of a suitable slide bearing material such as (sintered materials).

In one embodiment in which the slide ring is connected for rotation with the drive gear, it is ensured that the sliding action only occurs in the adjustment plane since the slide ring rotates together with the drive gear during operation and in so doing slides along the driving ring gear, so that it is always the lower sliding friction between the driving ring gear and the slide ring that takes effect during operation and the ring gear is easily adjustable.

There are embodiments in which the drive bodies are sleeve-shaped and are each rotatably mounted on a bearing pin fixed in the drive gear. This is a simple way of ensuring precise definition of the position of the drive bodies, and the bearing support is protected from external influences due to the sleeve-shaped design.

There are embodiments in which a bearing ball is arranged inside the drive body between the bearing pin and the drive body, which ball improves the load-bearing capacity and the mobility of the drive bodies on the bearing pin. The bearing pin and the bearing ball can here be made of a particularly hard bearing material and, if necessary, can be replaced independently of the drive body in the event of wear.

There are embodiments in which the drive gear is arranged on a vertical drive shaft and is coupled to a carrier gear—via this common drive shaft—and bar-type workpiece carriers can be coupled between the carrier gear and the drive gear in such a way that their weight load is applied via the carrier gear and the drive action (rotation about the axes of rotation) is applied via the drive bodies. This improves the ability of the drive bodies to rotate about their axes of rotation on the drive gear since the bearing supports do not have to absorb vertical loads resulting from the weight of the workpiece carriers and the workpieces coupled thereto.

There are embodiments in which each of the workpiece carriers has at an upper suspension end a suspension head for coupling to the carrier gear and a at a lower drive end a coupling head for the interlocking coupling and coupling for rotation with a drive end of the drive body. In this way, it is relatively easy to realize the rotation and support of even relatively heavy workpiece carrier arrangements since the vertical holding forces are absorbed via the suspension end or the suspension head formed there, and the coupling head arranged at the lower end, which is free of vertical weight loads, merely absorbs the rotational movement via the drive end of the drive body and transmits it to the workpiece carrier and the workpieces arranged thereon.

There are embodiments in which the suspension head can be coupled to the coupling head at the drive end via a removable connecting rod and the connecting rod passes through workpieces arranged on the workpiece carrier. In this way, a number of hollow and, where applicable, also differently shaped workpieces can be so to speak threaded onto the connecting rod and can be fixed between the suspension head and the coupling head in such a way that they perform the rotation of the drive bodies synchronously. The coupling of the workpieces for conjoint rotation can be realized in an either interlocking or frictional way—by bracing the workpieces between the suspension head and the coupling head via the connecting rod.

Now returning to the drawings:

FIG. 1 shows an exemplary embodiment of a workpiece carrier device 1 according to the invention comprising a drive gear 3 that is rotatable about a main axis 2 and is used for receiving (here 25) workpiece arrangements 4, each of which is arranged on the drive gear 3 so as to be rotatable about axes of rotation 5.

The function and design of the drive gear 3 will now be explained first with reference to FIGS. 2 to 5. The drive gear 3 is provided with a plurality of drive bodies 6, which comprise a drive sleeve 7 that is provided with a drive pinion 8 for conjoint rotation, which meshes with the internal toothing of a ring gear 9.

In the illustrated embodiment, 25 drive bodies 6 are arranged on a drive ring 10 of the drive gear 3. Each of the drive bodies 6 is mounted on a bearing pin 11 so that it projects into the interior of the drive sleeve 7 and supports the drive sleeve 7 on its bearing tip via a bearing ball 12. At the same time, the lower end faces of the drive sleeve 7 and of the drive pinion 8 remain free of the surface of the drive gear 3. It is thus ensured that the drive body 6 can freely rotate on the bearing pin 11. All drive bodies 6 are thus arranged on the drive ring 10 of the drive gear 3 in a rotatably circular fashion. The axes of rotation 5 are here arranged on a ring circle 14 which is surrounded by the ring gear 9, so that the ring gear toothing meshes with the external toothing of the drive pinion 8.

The nominal diameter of the ring gear 9 and the diameter of the ring circle 14 are in a ratio of about 1.1 to 1.5 relative to each other. The ring gear 9 is slidably mounted in an adjustment plane 17 by means of a slide ring 16 and is mounted by means of a link fork 18 in a rotationally fixed fashion with respect to a main frame (not shown).

An inner ring 19 shields the drive pinions 8 towards the inside, which are covered, on their upper side, by a perforated cover disk 20 and from which the drive sleeves 7 protrude.

When the drive gear 3 is driven about the main axis 2, the drive pinions 8 of the drive bodies 6 now roll on the ring gear 9, which is stationary relative to the rotation, and are thereby set in rotation about the axes of rotation 5, so that the drive bodies 6 move around the main axis 2 and thereby rotate about their (own) axis of rotation 5. They are interlockingly provided with a coupling head 22 via a coupling profile 21 at the tip of the drive sleeves 7, which coupling head is part of a workpiece carrier 23, which forms a component of the workpiece arrangement 4.

The design and function of the latter are explained with reference to FIG. 1. The drive gear 3 is coupled via a drive shaft 24 to a carrier gear 25, which is used to receive the workpiece arrangement 4. A suspension head 26 is here provided at the upper end of the workpiece arrangement 4 and is connected to the coupling head via a connecting rod 27. Workpieces 28 (here cylindrical sleeves) are threaded onto the connecting rod 27 between the suspension head 26 and the coupling head 22 and coupled to one another for conjoint rotation by bracing the connecting rod between the suspension head and the coupling head.

The workpiece arrangement 4 formed in this way is rotatably suspended in the carrier gear 25 via the coupling head 26 and coupled to the drive body 6 for conjoint rotation by means of the coupling head 22. When the drive gear 3 and the carrier gear 25 are rotated via the drive shaft 24, each of the workpiece arrangements, only one of which is shown in FIG. 1, is set in rotation about the axes of rotation 5 and rotated about the main axis 2, and in so doing they move in a coating chamber of a coating arrangement 100, which is indicated by a dashed line.

The toothings of the drive pinions 8 and the ring gear 9 are formed in a laser cutting process and there is a working clearance between the ring gear 9 and the drive bodies 6 and the drive pinions 8, respectively, which clearance is designed in such a way that the ring gear 9 centers itself around the various drive pinions 8 with little force during operation and drives them evenly.

Based on the nominal diameter of the ring gear 9 and/or the drive circle diameter, the working clearance is here about 0.15 to 1%, and, with a ring circle diameter $N_R$ of about 150 mm and a nominal circle diameter $N_H$ of the ring gear of about 170 mm, the working clearance is between 0.05 mm and 0.6 mm. The slide ring 16 is made of a slidable material, such as a sintered material, while the other components are formed substantially of corrosion-resistant steel materials (e.g. 1.4301).

Further embodiments and variations of the invention will be apparent to a person skilled in the art within the scope of the claims.

LIST OF REFERENCE SIGNS 1 workpiece carrier device
2 main axis
3 drive gear
4 workpiece arrangement
5 axis of rotation
6 drive body
7 drive sleeve
8 drive pinion
9 ring gear
10 drive ring
11 bearing pin
12 bearing ball
14 ring circle
15 ring gear toothing
16 slide ring
17 adjustment plane
18 link fork
19 inner ring
20 cover disks
21 coupling profile
22 coupling head
23 workpiece carrier
24 drive shaft
25 carrier gear
26 suspension head
27 connecting rod
100 coating arrangement
$N_R$ ring circle diameter
$N_H$ nominal diameter ring gear

The invention claimed is:

1. A workpiece carrier device, comprising:
a drive gear for receiving workpiece arrangements, which is rotatable about a main axis,
a number of drive bodies, which are arranged on the drive gear, that are each respectively rotatable about an axis of rotation and each has a drive pinion, and
a stationary driving ring gear with an internal toothing, which meshes with the drive pinions,
wherein each axis of rotation extends parallel to the main axis and is arranged in an annular region of the drive gear that runs concentrically in relation to the main axis, so that, when the drive gear rotates relative to the stationary driving ring gear, each drive body rotates about its their respective axis of rotation, and
wherein the stationary driving ring gear is slidably arranged in an adjustment plane running perpendicular to the main axis, and the drive bodies with their drive pinions are formed and arranged in relation to one another, such that a working clearance is provided between the stationary driving ring gear and drive pinions such that a driving action of the stationary driving ring gear is transferred to all drive pinions equally during operation.

2. The workpiece carrier device according to claim 1, wherein the working clearance is dimensioned in such a way that tooth geometries of the drive pinions and of the stationary driving ring gear can be produced in a thermal cutting process.

3. The workpiece carrier device according to claim 2, wherein the thermal cutting process is a laser cutting process.

4. The workpiece carrier device according to claim 1, wherein the adjustment plane is defined by a slide ring arranged between the drive gear and the stationary driving ring gear, which slide ring forms a sliding pair with the stationary driving ring gear in the adjustment plane.

5. The workpiece carrier device according to claim 1, wherein the drive bodies are sleeve-shaped and are each rotatably mounted on a bearing pin fixed in the drive gear.

6. The workpiece carrier device according to claim 5, wherein a bearing ball is arranged inside the drive body between the bearing pin and drive bodies.

7. The workpiece carrier device according to claim 1, wherein the drive gear is arranged on a vertical drive shaft and is coupled to a carrier gear, and bar-type workpiece carriers are coupled between the carrier gear and the drive gear in such a way that a weight load thereof is applied via the carrier gear and driving action is applied via the drive bodies.

8. The workpiece carrier device according to claim 7, wherein each of the bar-type workpiece carriers has, at an upper suspension end, a suspension head that is coupled to the carrier gear and, at a lower drive end, a coupling head that is interlockingly coupled to a drive end of the drive body and coupled thereto for conjoint rotation.

9. The workpiece carrier device according to claim 8, wherein the suspension head can be coupled to the drive end via a removable connecting rod, wherein the removable connecting rod passes through workpieces arranged on one of the bar-type workpiece carriers.

10. A coating arrangement comprising a workpiece carrier device according to claim 1.

* * * * *